United States Patent [19]
Schmidt

[11] 3,937,579
[45] Feb. 10, 1976

[54] PROCESS FOR THE DOUBLE-SIDED EXPOSURE OF A SEMICONDUCTOR OR SUBSTRATE PLATES, ESPECIALLY WAFERS, AS WELL AS APPARATUS FOR THE PURPOSE OF PARALLEL AND ROTATIONAL ALIGNMENT OF SUCH A PLATE

[75] Inventor: Jean Schmidt, Cluses, France
[73] Assignee: Karl Suss KG, Munich, Germany
[22] Filed: Nov. 15, 1973
[21] Appl. No.: 416,227

[30] Foreign Application Priority Data
Nov. 20, 1972 Germany............................ 2256759

[52] U.S. Cl. ................. 356/144; 355/132; 356/172
[51] Int. Cl.² ................... B41M 3/08; G03B 27/36; G03B 27/60
[58] Field of Search .......... 356/172, 138, 144, 148, 356/169; 317/235 J; 156/17, 11; 29/578, 579, 203 P, 203 B; 96/44; 350/237; 355/78, 79, 132

[56] References Cited
UNITED STATES PATENTS

| | | | |
|---|---|---|---|
| 3,156,563 | 11/1964 | Harrison et al. | 156/11 UX |
| 3,192,844 | 7/1965 | Szasz et al. | 29/578 X |
| 3,645,622 | 2/1972 | Cachon et al. | 355/132 |
| 3,718,396 | 2/1973 | Hennings | 356/172 X |
| 3,752,589 | 8/1973 | Kobayashi | 356/172 |

Primary Examiner—James W. Lawrence
Assistant Examiner—Marvin Nussbaum
Attorney, Agent, or Firm—Orrin M. Haugen

[57] ABSTRACT

The invention concerns a process for the two-sided exposure of a semiconductor or substrate plate, especially exposure of a wafer, through exposure masks which are arranged in plane parallel, parallel and rotational alignment to either side of a semiconductor plate. The invention further concerns an apparatus for parallel and rotational alignment to either side of a semiconductor plate. The invention further concerns an apparatus for parallel and rotational alignment of a semiconductor or substrate plate, especially alignment of a wafer, in relation to two exposure masks, operating on either of the two surfaces of the semiconductor or substrate plate, for the purpose of a two-sided exposure, in accord with the process established by the invention. An adjustable wedge-error correction head is provided supporting the semiconductor or substrate plate, for plane parallel adjustment of one surface, preferably the top one, of the semiconductor or substrate plate relative to the first exposure mask, also preferably the upper one, and an apparatus for bringing into contact the other surface of the semiconductor or substrate plate, preferably the lower one, relative to the second exposure mask, also preferably the lower one. A rotational compound slide table is provided, arranged in a plane parallel to the first exposure mask and displaying a mask mounting support for same, for the plane parallel position calibration of the first exposure mask relative to the semiconductor or substrate plate and to a microscope-type viewing device.

10 Claims, 3 Drawing Figures

PROCESS FOR THE DOUBLE-SIDED EXPOSURE OF A SEMICONDUCTOR OR SUBSTRATE PLATES, ESPECIALLY WAFERS, AS WELL AS APPARATUS FOR THE PURPOSE OF PARALLEL AND ROTATIONAL ALIGNMENT OF SUCH A PLATE

BACKGROUND OF THE INVENTION

It has already been long known how to expose semiconductors or substrate plates, especially wafers, on one side, in multiple fashion, with relatively great accuracy, in order to build up several semiconductor layers on over the other, each of which displays a special geometry which must lie in a precise predetermined disposition relative to the surface elements of each of the other layers.

During the course of the intensive development of integrated circuit devices, it is normally required that semiconductors or substrate plates, especially wafers, be exposed on both sides, in repeated cycles. With the present state of the art, this problem still has not been overcome. Moreover, an initial two-side exposure can be carried out only on a semiconductor or substrate plate, i.e., a disk, which is not already provided with some special geometry resulting from previous exposures. Such type of an initial exposure, based upon the state of the art, is carried out such that, beforehand, a top and bottom exposure mask with horizontally running planes are placed in planes parallel to one another and then, after introduction into the space between the two exposure masks, the semiconductor or substrate plate is laid upon the lower exposure mask. Next, using thin rods, the semiconductor or substrate plate is run through a rough parallel and rotational alignment relative to the lowe exposure mask, after which final two-sided exposure takes place through the exposure masks. It is understood that such type of rough calibration of the semiconductor or substrate plate relative to the lower exposure mask is insufficient for obtaining a satisfactory coverage of the geometric structures of the exposure masks with other geometric structures that are already disposed on the semiconductors or substrate plates, i.e., for the purpose of carrying out multiple exposures.

The task for the invention is to obtain a process that makes possible multiple exposure of semiconductors or substrate plates, especially wafers, on both sides, with sufficient congruency of the geometrical structures. This is achieved by initially bringing the two exposure masks into contact, plane parallel fashion, following a prior mutual parallel and rotational alignment. In addition to the fixing of their plane parallel adjustment, the relative distance between the two exposure masks in a direction running perpendicularly to their planes is fixed while retaining the plane parallel adjustment as well as the mutually parallel and rotational alignment. The semiconductors or substrate plates are brought into contact plane parallel fashion with a first of the two exposure masks following prior parallel and rotational alignment of those surfaces which are turned toward this exposure mask, and relative approach to the second exposure mask is connducted while a pre-established, short distance relative to the semiconductor or substrate plate is attained. The plane parallel adjustment as well as the mutually parallel and rotational alignment is retained.

A particularly favorable and reasonable technique for the execution of the process in accord with the invention can be achieved through means of an apparatus of the type already alluded to hereinabove which is characterized by the fact that an auxiliary rotational compound slide table is provided, in addition to a mask support, for accepting the second exposure mask. The drive slide of the first compound slide table, preferably the first rotational compound slide table associated to the first exposure mask, is coupled with the drive slide of the other compound slide table, preferably that associated with the auxiliary rotational compound slide table for the second exposure mask. The mask support frame of the one rotational compound slide table, preferably that of the rotational compound slide table driving the other rotational compound slide table, is connected to its associated rotational compound slide table through a support frame approachment guide running perpendicular to the plane of travel of the two compound slide tables. The mask support frame is constructed as an adjustable wedge-error calibration frame in one of the two compound slide tables, with the wedge-error correction head intended for accepting the semiconductor or substrate plate being bearingly mounted to a swivel arm which, when the mask supports are moved apart, is pivotable in a rotational plane that lies parallel to as well as between the planes of displacement of the two rotational compound slide tables, in the space between the two planes of displacement. The mask support frame is movable into the pivot position perpendicularly to the planes of displacement, opposite the mask support that it turned toward the semiconductors or substrate plates, until the semiconductor or substrate plate comes into contact with the exposure mask associated with this mask support and, which is again pivotable after bringing the semiconductor or substrate plate to the exposure mask turned toward them. Also, at least on the wedge-error correction head, there is provided a controllable support for freeing the semiconductor or substrate plate upon coming into contact with the exposure mask turned toward them (semiconductor or substrate plate), as well as for picking them up after completed exposure.

With an extensively modified apparatus, representing a kinematic reversal of this preferred apparatus, both mask supports are rigidly connected to their associated rotational compound slide tables and the drive slides of the one rotational compound slide table are connected with the drive slides of the other rotational compound slide table through a table approachment guide which runs perpendicular to the planes of displacement of both rotational compound slide tables. The table approachment guide of this modified example of embodiment corresponds, here, to the support approachment guide in the case of the preferred example of embodiment.

By means of the previously described apparatus in accordance with the present invention, and, indeed, as well as for both the preferred and the modified examples of embodiments, it is possible to adjust both exposure masks in planes parallel to one another, first to an acceptable parallel and rotational alignment, which is done with both rotational compound slide tables, through means of the wedge-error calibration frame associated with the one exposure mask and then, while maintaining this adjustment, move the two exposure masks apart through means of the support approachment arrangement, in the case of the preferred example of embodiment, or the table approachment arrangement, so that sufficient space is formed between the two exposure masks to permit introduction of the semiconductor or substrate plate which will be held in place by the wedge-error correction head arranged on the pivoting arm. Through means of the wedge-error correction head that has been pivoted into the space between the two exposure masks, it is now possible to bring the semiconductor or substrate plate into plane parallel contact with one of the two exposure masks, preferably the lower exposure mask, by lowering the wedge-error correction head, whereby any cushion of entrapped air between the semiconductor or substrate plate and the oppositely lying exposure mask can escape. After making the plane parallel adjustment of the semiconductor or substrate plate relative to the exposure mask turned toward it and, along with this, relative to the two exposure masks in the wedge-error correction head, this latter can raise up the semiconductor or substrate plate a short interval from the exposure mask toward which it is turned, whereupon it is now possible, through means of one of the two rotational compound slide tables whose drive slots are engaged in the drive slots of the other rotational compound slide table, to subject both exposure masks together to a parallel and rotational alignment relative to that of the semiconductor or substrate plate that is adjusted along a plane parallel to the two exposure masks. Finally, the esemiconductor or substrate plate can be brought to the exposure mask turned toward it; and in the case of a vertical arrangement one over the other, both exposure masks, by laying the semiconductor or substrate plate on the lower exposure mask. The wedge-error correction head is then outwardly pivotable out of the space between the two exposure masks by means of the pivoting arm, whereupon the exposure mask furthest away from the semiconductor or substrate plate can be lowered to the extent that a two-sided exposure of the semiconductor or substrate plate, lying in axactly parallel and rotational alignment to both exposure masks, can be carried out from either side. A particular advantage of the apparatus in accordance with the invention lies in the fact that, using a single microscope, it is possible to calibrate both exposure masks relative to one another as well as to the geometry of one side of the semiconductor plate relative to the microscopically observed exposure mask, by observation perpendicular to the planes of one of the two exposure masks, whereupon correct calibration of the other side of the semiconductor or substrate plate relative to the other exposure mask is automatically ensured. By exact plane parallel adjustment of the two exposure masks relative to each other as well as of the semiconductor or substrate plate relative to the two exposure masks, the surfaces to be observed through the microscope can be brought very closely together, dependent only upon the depth sharpness range of the microscope used.

BRIEF DESCRIPTION OF THE DRAWINGS

The invention is explained in more detail with reference to the drawings, in which.

DESCRIPTION OF THE PREFERRED EMBODIMENTS

Figure 1:
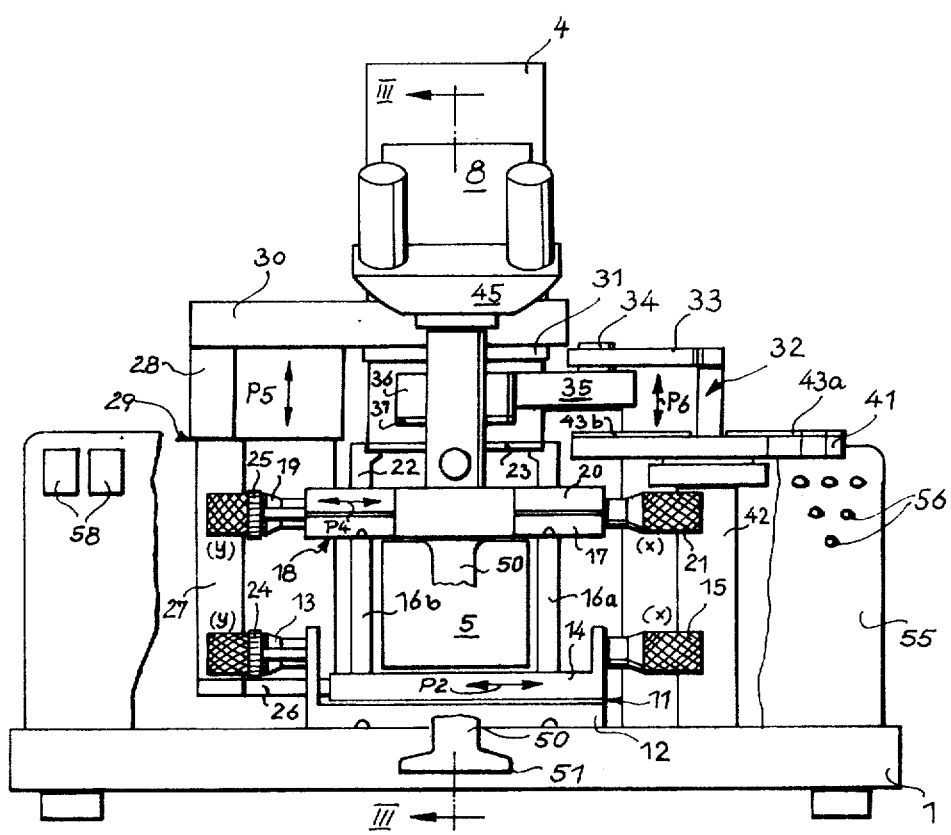
FIG. 1 is an example of embodiment for an apparatus in accordance with the invention, partially schematic and partially broken away and being viewed from the front.

The apparatus illustrated in the drawings is usable for semiconductor plates, in particular wafers, and for substrate plates made of an insulator material. A presupposition for carrying out the process in accordance with the invention as well as for use of the apparatus illustrated in the sketches is that the semiconductor or substrate plate to be exposed in nontranslucent, at least for the light to be used for illumination. In order to arrive at a rational explanation of the apparatus illustrated in the drawings the following explanation takes into consideration only a wafer as a special case of semiconductor plate, although the apparatus is, self understood, usable also for a substrate plate.

Located on base plate 1 is a lower lamphousing 2 which, on its top side, over an interlying fan 3, supports a top lamphousing 4. Rigidly connected with the lower lamphousing 2 is a lower illumination optical arrangement 5 which collimates the path of the rays (shown with dash-dot lines in FIG. 3) from a lower UV lamp 6 deflecting upwardly through means of a deflecting mirror 7 inclined 135° to the horizontal. In the same manner, an illumination optical arrangement 8 is rigidly connected to the upper lamphousing 4 which directs the path of the rays (also represented by dash-dot line) from an upper UV lamp 9, vertically downward, by means of a deflecting mirror 10 inclined at an angle of 45° to the horizontal. The optical axes of the vertical portion of the lower and upper path of rays are calibrated coincidentally.

Figure 3:
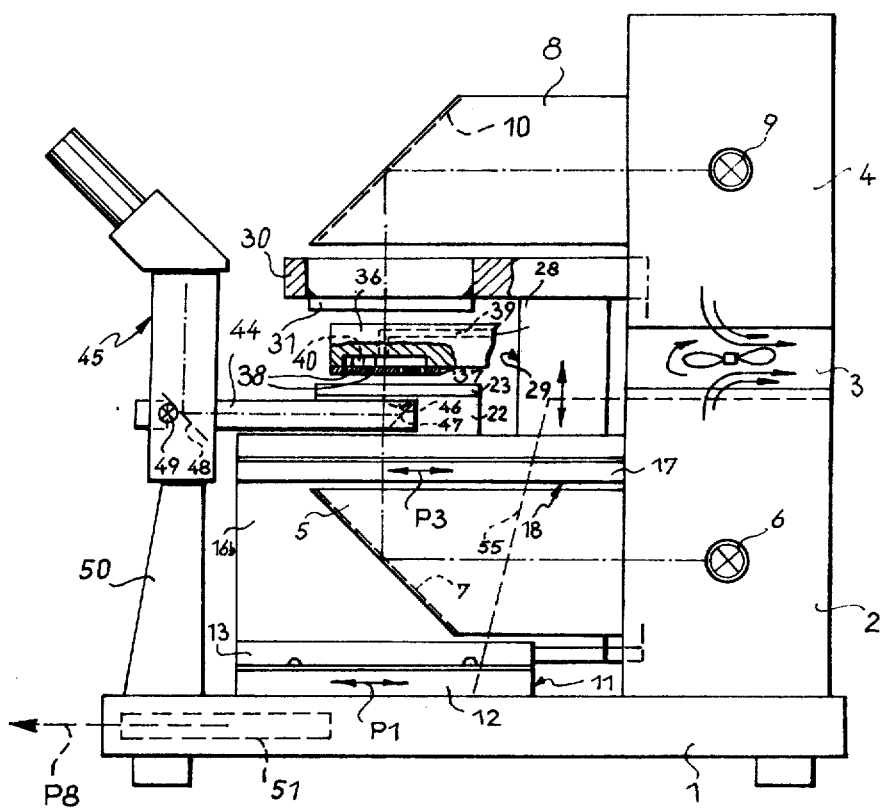
FIG. 3 is a sectional view taken along lines III—III of FIG. 1.

On base plate 1 there is a lower compound slide table 11 (shown schematically) with its drive slide 12 perpendicular to the plane of the view in FIG. 1 and displaceable in the y-direction, in the direction of the double arrow P1 of FIG. 3, by means of a micrometer screw 13. Drive slide 14 of the lower compound slide table 11 is displaceable in the direction of the double arrow P2 of FIG. 1, perpendicular to the plane of the view in FIG. 3, in the x-direction, through means of a micrometer screw 15.

Through means of two vertically extending spacer plates 16a, 16b, which display on top of each of their narrow surfaces a straight guide running perpendicular to the plane of the view in FIG. 1, there is bearingly mounted drive slide 17 of an upper compound slide table 18 which is displaceable perpendicularly to the plane of the view in FIG. 1, hence in the direction of double arrow P3 of FIG. 3, in the y-direction, through means of a micrometer screw 19. The drive slide 20 of compound slide table 18 which is displaceable in the direction of double arrow P4, hence perpendicular to the plane of the view of FIG. 3, in the x-direction, by means of a micrometer screw 21. Compound slide table 18 supports, on its top side, a wedge-error calibration frame 22, shown schematically only, for a lower exposure mask 23. The mechanism of the wedge-error calibration frame 22 serving for correction of wedge-error is known in the present state-of-the-art and can, for example, be constructed similar to the mechanism of the wedge-error correction head that is in accordance with patent publication 2,032,027 of the Federated Republic of Germany. As is particularly obtained from FIGS. 1 and 3, the light interval between the two compound slide tables 11 and 18 must be somewhat greater than the height of the lower illumination optical arragement 5 so that free displacement of both compound slide tables is possible without casting shadows on the lower illumination optical arrangement.

The two compound slide tables 11 and 18 can each be rotated through drive slides 14 and 20 relative to drive slides 12 and 17 be means of a collar screw 24 and 25 (rotating mechanism is not shown in detail because it is known in the present state-of-the-art), so that both compound slide tables 11, 18 will be designated as rotatable compound slide tables.

Rigidly connected with drive slide 14 of the lower rotatable compound slide table 11 is a short, horizontally-running piece 26 which supports a vertical post 27, displaying a rectangular cross-section. Movable up and down in the vertical direction along double arrow P5 on post 27, through means of a positioning member (not shown) is a shell 28 displaying a rectangular inner cross section. Components 27, 28 together form a support approachment guide 29, from which extends a stiff horizontal arm 30 whose free, projecting end displays, on its under side, a mask support for an upper exposure mask, which, when looking at it from a top view, finds itself practically covering lower exposure mask 23. By actuation of the positioning member available in the support approachment guide 29, it is possible to lower exposure mask 31 onto exposure mask 23 until the former comes in contact with the latter, whereby, in the case where calibration frame 22 is not locked, exposure mask 23 may be adjusted along a plane parallel to exposure mask 31 and then this plane parallel adjustment can be locked through means of calibration frame 22.

Figure 2:
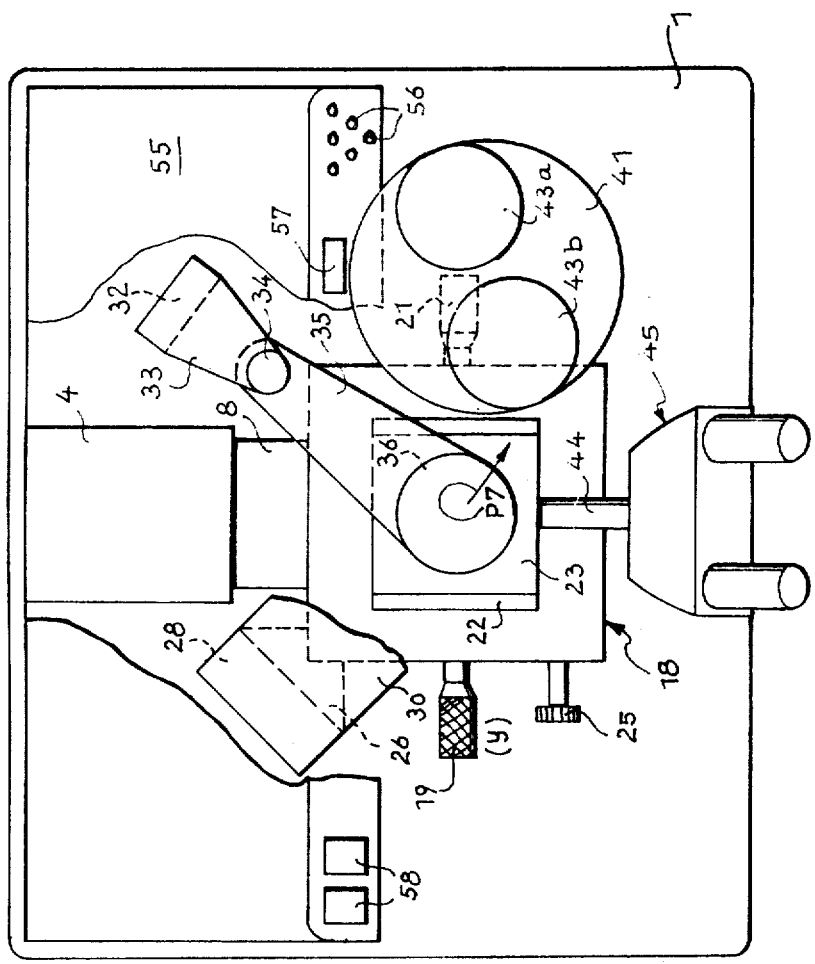
FIG. 2 is a top view of the apparatus in accordance with FIG. 1 also partially cut away and broken away.

In the direction of viewing in FIGS. 1, 2, at the right next to lamphousings 2, 4 as well as rotatable compound slide tables 11, 18 there is arranged on base plate 1 a vertical guide 32 that is movable in the direction of double arrow P6, which is constructed similar to the support approachment guide 29 and which displays at its upper end a yoke 33 whose free projecting end supports a bearing pin 34 for a pivoting arm 35. The pivoting arm 35, at its free projecting end displays a cylindrical wedge-error correction head 36 which, as can best be seen from FIG. 3, displays at its lower face surface a flat retainer plate 37 containing a group of evenly spaced air exhaust nozzles 38 over its surface. Exhaust or compressed air can be brought to the air exhaust nozzles 38, as required, through a conduit 39 and a suction chamber 40. The wedge-error correction head itself is not specifically shown since it is presently within the state-of-the-art and can, for example, be constructed in accordance with patent publication No. 2,032,027 of the Federated Republic of Germany. With the wedge-error correction head unlocked, it is possible to bring a wafer (not shown) that has been sucked up onto retainer plate 37 into contact with the lower exposure mask 23 whereby the wafer may be freely adjusted plane parallel to the lower exposure mask 23, whereafter the wedge-error correction head can be locked in this plane parallel positioning of the wafer. When the two exposure masks 23, 31 as is shown in FIGS. 1, 3, find themselves at an essential distance from one another, pivot arm 35 with wedge-error correction head 36 can be pivoted into the space between the two exposure masks 23, 31 so long as vertical guide 32 is in the position shown in FIG. 1. Subsequently, the vertical guide 32 can be lowered until the wafer that is being held onto retainer plate 37 by means of suction air comes into contact with the lower exposure mask 23 and, upon coming into contact, adjusts itself in a plane parallel to this latter. After locking the plane parallel position of the wafer in the wedge-error correction head 36, vertical guide 32 can be moved upwardly through a preselected interval in order either to calibrate the exposure mask relative to the wafer or to again pivot the pivot arm 35 out of the space between exposure masks 23, 31, as will be clarified still further in the following.

In the direction of viewing of FIG. 1, to the right next to the lower exposure mask 23, there is a cross-shaped rotatable table 41 that is rotatably bearing mounted on a vertical post 42, which is rigidly connected to base plate 1. Arranged on rotatable table 41 are two cross-shaped wafer supports 43a, 43b, on each of which can be laid a wafer of up to about 50 mm. diameter. As is particularly shown in FIG. 2, rotatable table 41 is rotatable through means of snap-catches in 180° steps such that the left wafer support 43b, as seen in the direction of viewing of FIG. 2, continually lies within the pivoting range of pivot arm 35 and the axis of wedge-error head 36, upon pivoting pivot arm 35 in accordance with curved arrow P7 of FIG. 2, is to be brought so as to cover the vertical axis running through the mid point of wafer support 43b. By lowering vertical guide 32, when pivot arm 35 is in its outward pivot position, it is possible then to remove from wafer support 43b a wafer by means of wedge-error correction head 36 or its retainer plate 37, or, on the other hand, deposit onto wafer support 43b a wafer that is being held by the wedge-error correction head 36 or its retainer plate 37.

As is gathered, particularly from FIGS. 1 and 3, calibration frame 22 for the lower exposure mask 23 is constructed such that it is possible to insert the objective tube 44 of a microscope 45, in a horizontal plane of motion, between drive slide 20 of the upper rotatable cross-table 18 as well as the bottom side of the lower exposure mask 23. The objective tube 44 includes an objective 46 as well as a deflecting mirror 47 that is inclined at an angle of 45° to the horizontal, whereby objective 46, which is approximated to the vertical optical axis of the path of the rays of illumination optical arrangements 5, 8, is adjustable. Arranged inside of microscope 45 is a deflecting mirror 48, inclined at an angle of 135° to the horizontal, which is semi-translucent both to ocular path rays and to the path of rays from a microscope illuminating lamp 49. The path of rays of microscope 45 is shown in dash-dot lines. Microscope 45 is mounted on a vertical post 50 which is movable within a horizontal guide 51 (shown in FIG. 3 by dot-dash lines) within base plate 1, along the path of an arrow P8, such that objective tube 44 of microscope 45 attains outside the path of rays between the two exposure masks 23, 31. In this manner, it is possible, through means of microscope 45, to check the parallel and rotational alignment of the two exposure masks 23, 31 against one another and the parallel and rotational alignment of exposure mask 23 (coupled with exposure mask 31) relative to the under side of the wafer supported by the wedge-error correction head 36, and after locking the setting, to move the microscope 45 along with its objective tube 44 out of the path of the rays in order to be able to illuminate the wafer from both sides through illumination optical arrangements 5, 8.

The lower, rear area of the apparatus is surrounded by a housing 55 which displays at its front a maintenance desk with group of maintenance buttons 56 (FIGS. 1, 2) with a separation indicator 57 for setting the depth sharpnenss of microscope 45 and with timers 58 for setting exposure time of the water against the lower exposure mask 23. Push buttons 56 are a component of a control program (not shown) contained within the apparatus, in order to run the operational processes described more fully in the following, semi-automatically or fully automatically.

At the beginning of an operational cycle, as opposed to the representation in FIGS. 1, 2, pivot arm 35 is in an outwardly pivoted position whereby the axis of the wedge-error correction head 36 coincides with the axis of the mid point of wafer support 43b. Objective tube 44 and objective 46 of microscope 45 are in the position shown in FIG. 3. First, the support approachment guide 29 is lowered until the upper exposure mask 31 comes into contact with the lower exposure mask 23 and wedge-correction calibration frame 22 permits a plane parallel adjustment of the lower exposure mask 22 against upper exposure mask 31. In this plane parallel position, exposure mask 23 is locked in place by the wedge-error calibration frame 22. Next, the support approachment guide 29 is raised a pre-determined distance of from about $5 \times 10^{-2}$ mm. to 2 mm., which was set on separation indicator 57 prior to startup. This distance must lie within the depth sharpness range of microscope 45. In the separation position now attained, a parallel and rotational alignment of the lower exposure mask 23 relative to the upper exposure mask 31 is undertaken through means of the micrometer screws 19, 21 as well as collar screw 25, with corresponding positioning of the rotational compound slide table 18, until the geometries of the two exposure masks 23, 31 completely cover each other. Since the exposure masks 23, 31 are adjusted plane parallel, it is possible to calibrate over wide ranges without having to change the sharpness setting of microscope 45 in any manner whatsoever.

After having carried out parallel and rotational alignment of the two exposure masks 23, 31, the support approachment guide 28 is moved upwardly in the vertical direction until the position shown in FIGS. 1 and 3 is reached. Simultaneously, a wafer that is to be exposed on both sides, and which had been picked up from wafer support 43b by the wedge-error correction head 36 and its retainer plate 37 through admission of suction air, and the pivoting arm 35 along with wedge-error correction head 36 is pivoted into the position shown in FIGS. 1, 2 in the space between the two exposure masks 23, 31. Then, the vertical guide 32 is lowered until the wafer being retained by the wedge-error correction head 36 comes into contact with the lower exposure mask 23 and positions itself plane parallel to this lower exposure mask 23. The plane parallel positioning of the wafer relative to the lower exposure mask 23, which was achieved in this manner, is locked in the wedge-error correction head 36 whereupon, through slight raising of vertical guide 32, there is produced a separation between the lower surface of the wafer as well as the upper surface of the lower exposure mask, in a range that lies preferably between 10 and 900 microns. Now, with a rigidly arrested pivoting arm 35, both exposure masks 23, 31 can be subjected to a parallel and rotational alignment relative to the wafer, without affecting in any way the calibration already carried out on the other side, in that, maintaining the positioning of the upper rotatable compound slide table 18 by means of micrometer screws 13, 15 as well as collar screw 24, the lower rotatable compound slide table 11 can be actuated such that, under observation through objective 46 of microscope 45, the lower exposure mask 23 is subjected to a parallel and rotational alignment relative to the geometry of the lower surface of the wafer. If this alignment is carried out, then the upper exposure mask 31 is also precisely aligned relative to the geometry of the top surface of the wafer (which cannot be observed through microscope 45).

Then, vertical guide 32 has again moved downwardly until the under surface of the wafer impinges upon the top surface of the lower exposure mask 23. This position of contacting engagement is maintained with a force of approximately 100 Pond for 0.1 to 0.5 seconds, whereby is ascertained that the air cushion present between the wafer and the lower exposure mask 23 can be completely eliminated. Then, the wedge-error correction head 36 is acted upon, through conduit 39, with compressed air at about 1 atmosphere, whereafter the vertical guide 32, along with wedge-error correction head 36, is raised to the position shown in FIGS. 1, 3. Of greatest importance in this process is, on the one hand, that the wafer comes loose from the retainer plate 37 of wedge-error correction head 36 without the slightest rotation or displacement, on the other hand, also after coming loose, it remains lying on the lower exposure mask 23 without any rotation or displacement, i.e., hence is not "floating" on a cushion of air. In completing this work procedure, pivoting arm 35 pivots outwardly in accordance with arrow P7 of FIG. 2. Additionally, microscope 45 with its objective tube 44 is now moved out along the horizontal guide 51 out of the vertical path of rays from illumination optical arrangements 5, 8.

Next, the support approachment guide 29, along with the upper exposure mask 31 is moved vertically downward until the lower surface of exposure mask 31 displays only a very short interval from the upper surface of the wafer. Then, the UV lamps 6, 9 are turned on and the wafer is exposed through the lower exposure mask 23 as well as through the upper exposure mask 31.

After exposure has been completed, the support approachment guide 29, along with the upper exposure mask 31, is again moved upwardly until the position shown in FIGS. 1, 3 is reached. Then, the pivot arm 35, along with the wedge-error correction head 36, is swiveled inwardly between exposure masks 23, 31 and lowered onto the wafer through vertical guide 32. The wedge-error correction head is then acted upon with suction air and picks up the exposed wafer. The vertical guide 32 next to the wedge-error correction head 36, as well as to pivot arm 35, is again moved upwardly to the position shown in FIGS. 1, 3, whereafter pivoting arm 35 pivots out over the wafer support 43b of rotatable 41, in accordance with arrow P7 of FIG. 2. By lowering vertical guide 32 along with pivot arm 35 and wedge-error correction head 36, as well as acting upon wedge-error correction head 36 with compressed air, the wafer is laid onto wafer support 43b. Finally, the rotatable table 41 is rotated 180°, whereby an unexposed wafer, which has in the meantime been laid onto wafer support 43a, comes to lie under the wedge-error correction head 36 of the outwardly pivoted pivot arm 35. Then the processes described repeat themselves in similar manner for the wafer that is now in wafer support 43a. The operational cycles for the apparatus can be carried out semi-automatically or fully automatically under program control.

I claim:

1. Process for the simultaneous double-sided exposure of a substrate plate, such as a semiconductor wafer, bearing a pre-disposed pattern on at least one surface through first and second exposure masks arranged in plane parallel, parallel and rotational alignment with each of said exposure masks being coordinated and in registry with one predetermined side of a wafer to be treated, characterized by the steps of:
   a. bringing the two exposure masks into contact in mutual plane-parallel alignment and thereafter aligning said masks into mutual plane parallel and plane rotational alignment;
   b. moving said masks relatively away from each other along an axis normal to the planes thereof, while retaining said mutual plane parallel and plane rotational alignments;
   c. forcing said substrate into plane-parallel air cushion free contact and into registry with a first of the two exposure masks ad fixing said plane-parallel alignment while maintaining said mutual plane parallel and plane rotational alignment between said masks;
   d. separating said wafer from said first exposure mask by a predetermined distance and performing a parallel and rotational alignment and registration of said wafer with respect to both exposure masks;
   e. moving said second exposure mask toward an opposed surface of said wafer while retaining the registry mutual plane parallel and mutual plane rotational alignments between said exposure masks with respect to each other and with respect to said wafer; and
   f. simultaneously exposing said wafer through said first and second exposure masks.

2. Apparatus for parallel and rotational alignment of a substrate plate such as a semiconductor wafer, or the like, relative to first and second exposure masks adapted to be effective to one to either of the two opposed major surfaces of the wafer, for the purpose of double-sided exposure thereof, and comprising:
   a. means for establishing an exposure beam path for said opposed surfaces of a wafer held by said apparatus;
   b. an adjustable wedge-error correction head for supporting the wafer for plane parallel adjustment of one major surface of the wafer relative to the first of said exposure masks;
   c. apparatus for moving the opposed surface of said wafer into contact with said second exposure mask;
   d. first support means for arranging and supporting said first exposure mask and including a rotational compound slide table, and having means for the plane parallel position calibration of said first exposure mask relative to one major surface of said wafer relative to a microscopic viewing device;
   e. a microscopic viewing device in viewing relationship with an exposure mask supported in said first support means;
   f. an auxiliary rotational compound slide table having a second mask support means for receiving the second of said exposure masks; and
   g. means coupling the drive slide of said first rotational compound slide table to the drive slide of said auxiliary rotational compound slide table, the arrangement being such that:
      1. the first mask support means is connected to its associated rotational compound slide table through a support approachment guide means extending normal to the plane of travel of the first and second compound slide tables;
      2. one of said mask supports being constructed as an adjustable wedge-error calibration frame in one of said compound slide tables; said wedge-error correction head being arranged to receive said wafer and being bearingly mounted to a swivel arm, with said swivel arm being pivotable in a rotational plane lying generally parallel to and intermediate the planes of displacement of said two rotational compound slide tables, said swivel arm being pivotally movable along an axis perpendicular to the planes of displacement of said first and second mask support means;
      3. means on said swivel arm for moving said swivel arm together with a wafer disposed thereon toward the surface of a selected one of said exposure masks until contact is achieved between the surface of said wafer and the surface of said selected exposure mask; and
      4. means on said swivel arm for releasably retaining said wafer for carrying said wafer to and from contact with said selected exposure mask.

3. The apparatus in accordance with claim 2 being particularly characterized in that the planes of travel of said two rotational compound slide tables extend generally horizontally and the two rotational compound slide tables are arranged in generally superimposed relationship, one over the other.

4. The apparatus in accordance with claim 3 being particularly characterized in that the mask support of the second rotational compound slide table is arranged below the mask support of said first rotational compound slide table for said first exposure mask and that means are provided for releasing said wafer from said wedge-error correction head and thereafter depositing said wafer onto said second exposure mask under the effect of the force of gravity.

5. Apparatus in accordance with claim 3 being particularly characterized in that the controllable support of the wedge-error correction head includes a smooth support plate having a group of substantially identical air nozzles on the outer surface thereof and distributed over the surface thereof, and means for selectively exposing said nozzles to air under reduced or super pressure.

6. Apparatus in accordance with claim 4 being particularly characterized in that means are provided for maintaining contact between said wafer and said second exposure mask by a force of approximately 100 Pond for a predetermined period of from 0.1 to 0.5 seconds.

7. Apparatus in accordance with claim 2 being particularly characterized in that said microscopic viewing apparatus is arranged for observation of said second mask support from a point below the first mask support, and is movable horizontally outwardly from the exposure beam path.

8. Apparatus in accordance with claim 2 being particularly characterized in that disposed adjacent to and above the said first mask support as well as adjacent to and below the said second mask support there is provided for each, on the side away from said wafer support, a fixed illuminating optical arrangement.

9. Apparatus for parallel and rotational alignment of a substrate plate such as a semiconductor wafer, or the like, relative to first and second exposure masks adapted to be effective to one to either of the two opposed major surfaces of the water, for the purpose of double-sided exposure thereof, and comprising:
 a. means for establishing an exposure beam path for said opposed surfaces of a wafer held by said apparatus;
 b. an adjustable wedge-error correction head for supporting the wafer for plane parallel adjustment of one major surface of the wafer relative to the first of said exposure masks;
 c. apparatus for moving the opposed surface of said wafer into contact with said second exposure mask;
 d. support means for arranging and supporting said first and second exposure masks and including first and second rotational compound slide tables, each having means for the plane parallel position calibration of said first and second exposure masks relative to one major surface of each of said wafers relative to a microscopic viewing device;
 e. a microscopic viewing device in viewing relationship with an exposure mask supported in each of said first and second support means; and
 f. means coupling the drive slide of said first rotational compound slide table to the drive slide of said second rotational compound slide table, the arrangement being such that:
  1. said first and said seond mask support means being rigidly connected to their associated rotational compound slide tables and the drive slide of said first rotational compound slide table is connected with the drive slide of said second rotational compound slide table through a table approachment guide which extends generally perpendicularly to the point of travel of said two rotational compound slide tables;
  2. one of said mask supports being constructed as an adjustable wedge-error calibration frame in one of said compound slide tables; said wedge-error correction head being arranged to receive said wafer and being bearingly mounted to a swivel arm, with said swivel arm being pivotable in a rotational plane lying generally parallel to and intermediate the planes of displacement of said two rotational compound slide tables, said swivel arm being pivotally movable along an axis perpendicular to the planes of displacement of said first and second mask support means;
  3. means on said swivel arm for moving said swivel arm together with a wafer disposed thereon toward the surface of a selected one of said exposure masks until contact is achieved between the surface of said wafer and the surface of said selected exposure mask; and
  4. means on said swivel arm for releasably retaining said wafer for carrying said wafer to and from contact with said selected exposure mask.

10. The apparatus in accordance with claim 9 being particularly characterized in that the planes of travel of said two rotational compound slide tables extend generally horizontally and the two rotational compound slide tables are arranged in generally superimposed relationship, one over the other.

* * * * *

UNITED STATES PATENT OFFICE
CERTIFICATE OF CORRECTION

PATENT NO. : 3,937,579
DATED : February 10, 1976
INVENTOR(S) : Jean Schmidt

It is certified that error appears in the above-identified patent and that said Letters Patent are hereby corrected as shown below:

Column 1, line 13, "on" should read -- one --.
Line 35, "lowe" should read -- lower --.

Column 3, line 27, "esemi-" should read -- semi- --.

Column 7, line 21, "22" should read -- 23 --.

Column 9, line 22, "ad" should read -- and --.

Column 11, line 5, "water" should read -- wafer --.

Signed and Sealed this twentieth Day of April 1976

[SEAL]

Attest:

RUTH C. MASON
Attesting Officer

C. MARSHALL DANN
Commissioner of Patents and Trademarks